United States Patent
Perner et al.

(10) Patent No.: US 6,262,625 B1
(45) Date of Patent: Jul. 17, 2001

(54) OPERATIONAL AMPLIFIER WITH DIGITAL OFFSET CALIBRATION

(75) Inventors: Frederick A. Perner, Palo Alto, CA (US); Kenneth J. Eldredge, Boise, ID (US); Lung T. Tran, Saratoga, CA (US)

(73) Assignee: Hewlett-Packard Co, Palo Alto, CA (US)

( * ) Notice: Subject to any disclaimer, the term of this patent is extended or adjusted under 35 U.S.C. 154(b) by 0 days.

(21) Appl. No.: 09/430,238

(22) Filed: Oct. 29, 1999

(51) Int. Cl.[7] .................................................. G01R 19/00
(52) U.S. Cl. .................................................. 330/2; 330/253
(58) Field of Search .............................. 330/2, 253, 261; 327/307

(56) References Cited

U.S. PATENT DOCUMENTS

| | | | | |
|---|---|---|---|---|
| 5,059,920 | * | 10/1991 | Anderson et al. | 330/253 |
| 5,268,601 | * | 12/1993 | Cossins | 330/289 |
| 5,410,265 | * | 4/1995 | Jain et al. | 330/2 |
| 5,990,738 | * | 11/1999 | Wright et al. | 330/2 |
| 6,034,569 | * | 3/2000 | Lan et al. | 327/307 |
| 6,043,706 | * | 3/2000 | Nowak et al. | 330/2 |

* cited by examiner

Primary Examiner—Robert Pascal
Assistant Examiner—Khanh Van Nguyen

(57) ABSTRACT

An operational amplifier includes transistors for providing a controlled current path. At least one of the transistors is in an isolated well in a substrate. Offset of the operational amplifier is corrected by applying a back gate bias voltage to at least one isolated well and changing impedance of the transistors. The proper back gate bias voltage and transistor impedance are determined by incrementally adjusting the back gate bias voltage and then incrementally adjusting the transistor impedance. Calibration values are stored in register memory. Such calibration may be performed by an auto offset calibration process.

26 Claims, 7 Drawing Sheets

OPERATIONAL AMPLIFIER WITH DIGITAL OFFSET CALIBRATION

BACKGROUND OF THE INVENTION

The invention relates to operational amplifiers. More specifically, the invention relates to offset error calibration in an operational amplifier.

There are many different uses for operational amplifiers. For example, operational amplifiers may be used as unity gain amplifiers and transimpedance amplifiers. They may also be used as direct injection charge amplifiers.

Offset error can be an important issue in the design of operational amplifiers. For instance, the output of a typical unity gain amplifier without offset error correction is vo=vi+ofst, where vi is the input voltage, ofst is the offset voltage and vo is the output voltage. The output of a typical direct injection charge amplifier without error offset correction is vo=v+ofst, where v is a prescribed voltage.

The source of offset error may arise from the physical design of the operational amplifier or it may arise from process variations. Circuit thresholds, the mismatch of device sizes, and circuit operating conditions are all sources of offset error. Physical size variations inherent in the process of integrated circuits and process parameter variations are sources of offset error that come from manufacturing processes and are basic limitations of the process technology. In CMOS operational amplifiers, threshold voltage process variations provide a major source of offset error.

Different analog techniques for calibrating offset error have been suggested. One analog technique involves correct transistor sizing and careful physical layout to minimize the basic offset parameters. Even with an optimal design, however, offset correction by design alone might not be good enough to hold the offset voltage to within tens of micro-volts.

Another analog technique involves the use of a switched capacitor circuit for correcting offset error. A typical switched capacitor circuit uses a high gain operational amplifier to correct for differential amplifier offsets. One disadvantage of this circuit is the use of a large offset correction capacitor to sample and hold offset correction data. The capacitor is made large to minimize leakage and decay effects. Fabrication of the large capacitor also involves special IC process steps and a considerable amount of circuit area. Also, a control requirement to hold the offset voltage to within tens of microvolts results in a very high refresh rate.

Yet another technique involves analog controlled offset calibration. Differential current modification is described as a 'nulling input port circuit' in Enz and Gabor; "Circuit Techniques for Reducing the Effects of Op-Amp Imperfections: Autozeroing, Correlated Double Sampling, and Chopper Stabilization"; Proceedings of the IEEE, Vol. 84, No 11, November, 1996, page 1597. Gm modification is described as correction with a 'programmable current mirror' in Yu and Geiger, "Nonideality Consideration for High-Precision Amplifier—Analysis of Random Common Mode Rejection Ratio"; IEEE Transactions on Circuits and Systems; Vol 40, No 1; January 1993; pages 1–12. With both of these analog techniques, special analog circuitry is used to generate analog control signals. Additional circuits are used to sample and store the analog control signals. Normal circuit leakage currents result in analog control signal data being refreshed frequently. In gm modification and differential current modification, the analog control techniques are subject to the same sample and hold limitations as the switched capacitor technique.

SUMMARY OF THE INVENTION

According to one aspect of the invention, digital offset calibration is performed by an integrated circuit having a calibration mode of operation and a normal mode of operation. An operational amplifier of the integrated circuit includes a plurality of transistors, some of which are in isolated wells in a substrate. The transistors provide a controlled current path. A programmable calibration circuit of the integrated circuit is responsive to a digital value. The calibration circuit may provide a back gate bias voltage to at least one of the isolated wells in the substrate and/or adjust impedance of the transistors providing the controlled current path. Level of the back gate bias voltage and an amount of impedance adjustment are determined by the digital value.

The integrated circuit further includes a test circuit operable during the calibration mode. The test circuit includes a test signal source and a number generator for providing a plurality of different numbers to the calibration circuit while an input signal is being supplied to an input of the operational amplifier. The operational amplifier provides an output signal in response to the input signal.

The integrated circuit also includes memory for storing a digital value that causes the output signal to be within a desired limit of the test signal during the calibration mode. The memory provides the stored value to the calibration circuit during the normal mode of operation.

Other aspects and advantages of the present invention will become apparent from the following detailed description, taken in conjunction with the accompanying drawings, illustrating by way of example the principles of the invention.

DETAILED DESCRIPTION OF THE INVENTION

Figure 1:
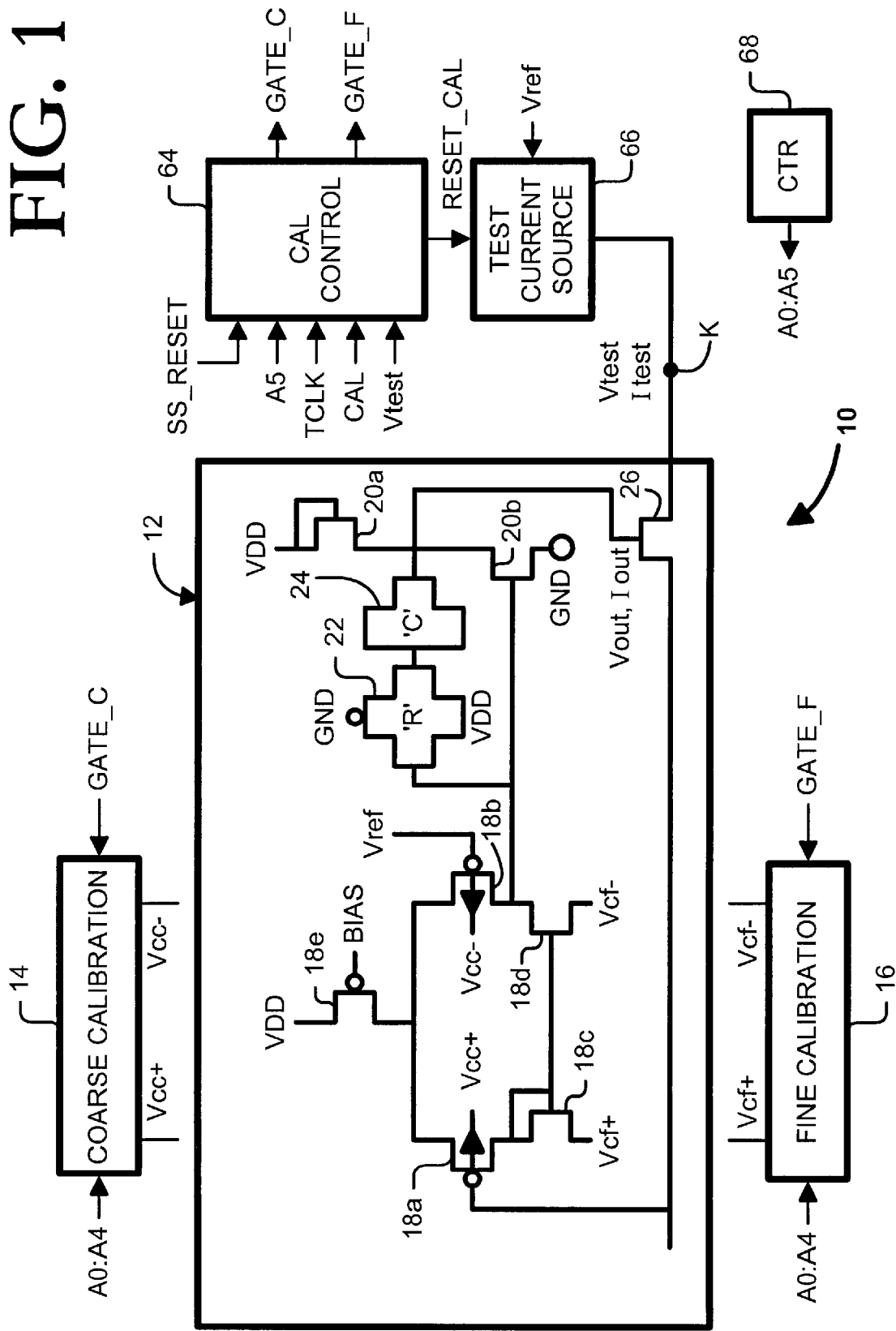
FIG. 1 is an illustration of a direct injection charge amplifier having digital offset calibration.

As shown in the drawings for purposes of illustration, the present invention is embodied in an integrated circuit including a direct injection charge amplifier having digital offset calibration. Because calibration is performed digitally, calibration data does not drift with normal leakage currents. Therefore, the use of special analog components (e.g., low leakage transistors, resistors and linear capacitors) is avoided. Moreover, the offset correction can be performed by an auto-calibration process. Additionally, the digital offset correction corrects for errors in current steering circuitry and other circuits forming a part of the input current path of the direct injection charge amplifier.

Figure 1A:
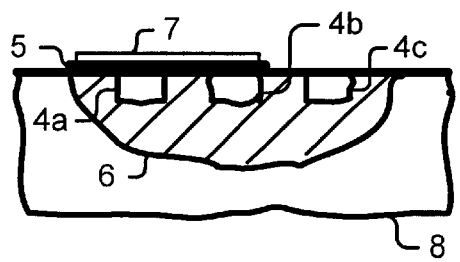
FIG. 1a is an illustration of a charge amplifier transistor in an isolated well in a substrate.

Reference is made to FIG. 1, which shows a circuit 10 including a direct injection charge amplifier 12, a coarse calibration circuit 14 and a fine calibration circuit 16 formed on a substrate. The charge amplifier 12 includes a PMOS differential amplifier. First, second and third PMOS transistors 18a, 18b and 18e and first and second NMOS transistors 18c and 18d of the differential amplifier provide a controlled current path. The substrate is common to the NMOS transistors 18c and 18d. However, the PMOS transistors 18a and 18b are in isolated N-type wells in the substrate. A PMOS transistor in an isolated well 6 in a substrate 8 may be formed by two P-type diffusions 4a and 4b bridged by an oxide barrier 5 and covered by a gate electrode 7 (see FIG. 1a). An N-type diffusion 4c in the well 6 is used as a contact to the well 6 (Again, see FIG. 1a). These N-type diffusions allow the back gate bias of the first and second PMOS transistors 18a and 18b to be controlled. Arrows extending through gates of the PMOS transistors 18a and 18b schematically represent connections to the substrate.

The differential amplifier is followed by a second stage amplifier circuit including two transistors 20a and 20b for boosting the gain so that the output can be controlled to a desired value when the feedback loop is closed. The feedback loop includes the first PMOS transistor 18a, followed by the second stage operational amplifier circuit 20a and 20b and a current source transistor 26. The feedback signal is the output voltage Vout and the loop is closed when the output voltage Vout is applied to the gate of the first PMOS transistor 18a.

As a consequence of working with a high gain amplifier, closed loop stability becomes an issue. Frequency compensation components (a resistor-capacitor compensation circuit 22, 24) controls the stability of the second stage operational amplifier circuit by reducing high frequency gain of the second stage amplifier circuit and thereby preventing the closed loop operational amplifier from going unstable.

The direct injection charge amplifier 12 further includes the current source transistor 26, which has a gate coupled to an output of the R-C circuit 22/24 and a drain-source path coupled to an input of the differential amplifier. In the normal operation mode, the circuit 10 senses and controls the output voltage Vout to a prescribed value by adjusting the current in the current source transistor 26 and then holding the current in the current source transistor 26 constant during a period of time.

The coarse calibration circuit 14 performs coarse offset correction during a normal mode of operation. The coarse calibration circuit 14 performs the coarse correction by applying a back gate bias voltage Vcc+ and Vcc− to the isolated wells of the first and second PMOS transistors 18a and 18b. The level of the back gate bias voltage Vcc+ and Vcc− is set according to a first digital number, which is stored in the coarse calibration circuit 14. The sensitivity of the offset voltage to back gate voltage variations can be rather large. Therefore, applying the back gate bias voltage Vcc+ and Vcc− is better suited for making coarse corrections to the offset voltage.

The fine calibration circuit 16 performs fine offset correction during the normal mode of operation. The fine correction is performed by adjusting impedance of the transistors 18a, 18b, 18c, 18d and 18e in the differential amplifier. The amount of the impedance adjustment is determined by a second digital number, which is stored in the fine calibration circuit 16.

Figure 2:
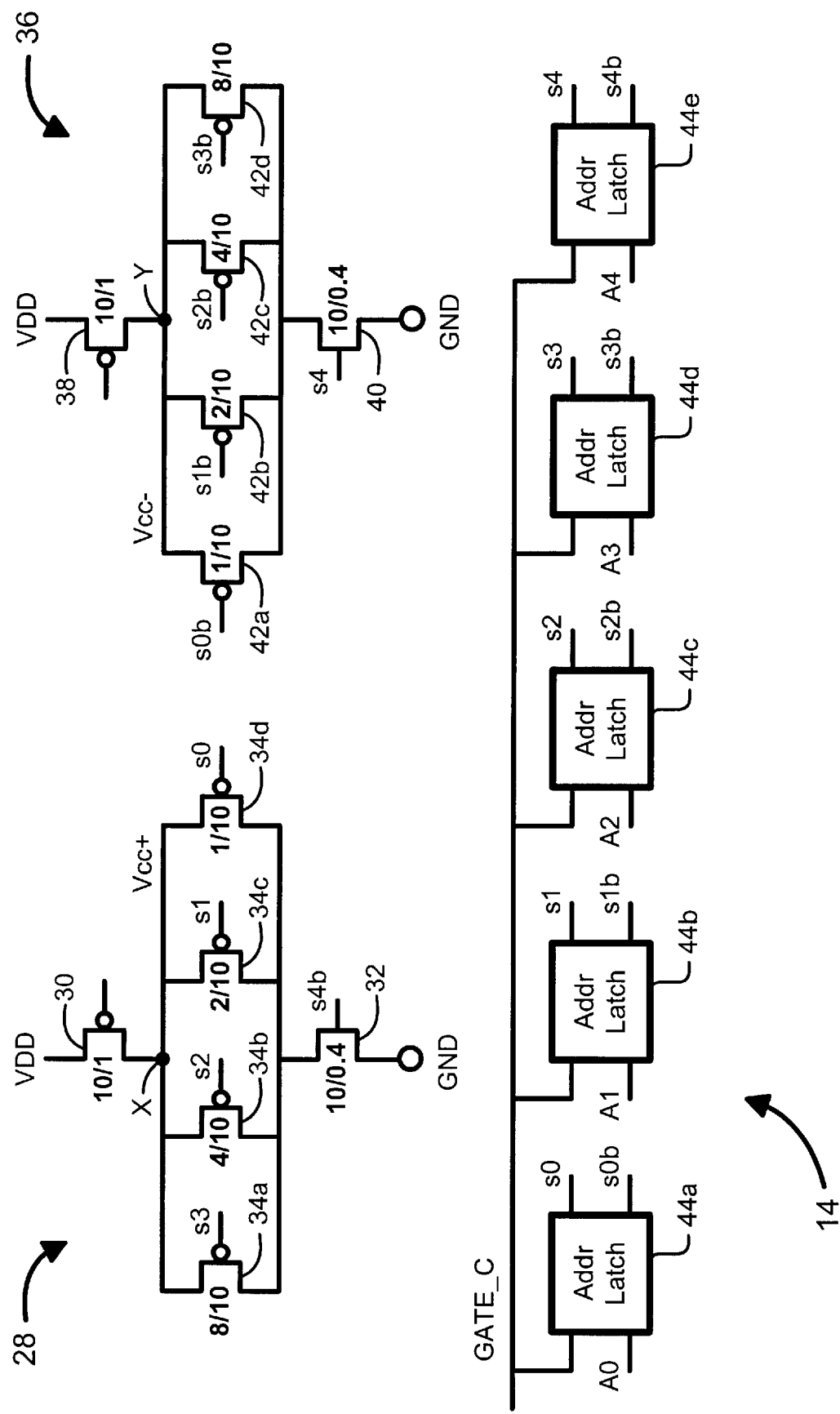
FIG. 2 is an illustration of a coarse calibration circuit for the amplifier of FIG. 1.

Reference is now made to FIG. 2, which shows the coarse calibration circuit 14 in greater detail. The coarse calibration circuit 14 includes a pair of programmable voltage dividers 28 and 36 for developing the back gate bias voltage Vcc+ and Vcc− for the isolated wells of the PMOS transistors 18a and 18b. Each voltage divider 28 and 36 is connected between a source of operating potential (VDD) and a reference potential (GND).

The first voltage divider 28 is shown, by way of example, as being formed by upper and lower transistors 30 and 32, and four middle transistors 34a, 34b, 34c and 34d having different drain-source path resistances. The numbers 10/1, 1/10, 2/10, 4/10 and 8/10 represent transistor length to width size the for voltage divider. Transistor size variations set the voltage divider ratios. Turning ON different combinations of the middle transistors 34a, 34b, 34c and 34d will change the voltage drop Vcc+ between a first node X and ground GND. This voltage drop Vcc+ is applied to the isolated well of the first PMOS transistor 18a.

The second voltage divider 36 also includes upper and lower transistors 38 and 40, and four middle transistors 42a, 42b, 42c and 42d having different drain-source path resistances. Turning ON different combinations of the middle transistors 42a, 42b, 42c and 42d will change the voltage drop Vcc− between a second node Y and ground GND. This voltage drop Vcc− is applied to the isolated well of the second PMOS transistor 18b.

During the normal mode of operation, the middle transistors 34a, 34b, 34c, 34d, 42a, 42b, 42c and 42d are turned ON and OFF according to a first number stored in a first group of static latches 44a, 44b, 44c and 44d. A fifth latch 44e controls the lower transistors 32 and 40 so that either positive or negative correction is performed. The coarse calibration circuit 14 shown in FIG. 2 can control the back gate bias voltage Vcc+ and Vcc− to as many as $2^5$ different levels.

Thus, the first number determines the back gate bias voltage Vcc+ and Vcc− applied to the isolated wells of the first and second PMOS transistors 18a and 18b. The static latches 44a, 44b, 44c and 44d are unaffected by circuit noise or leakage.

Figure 3:
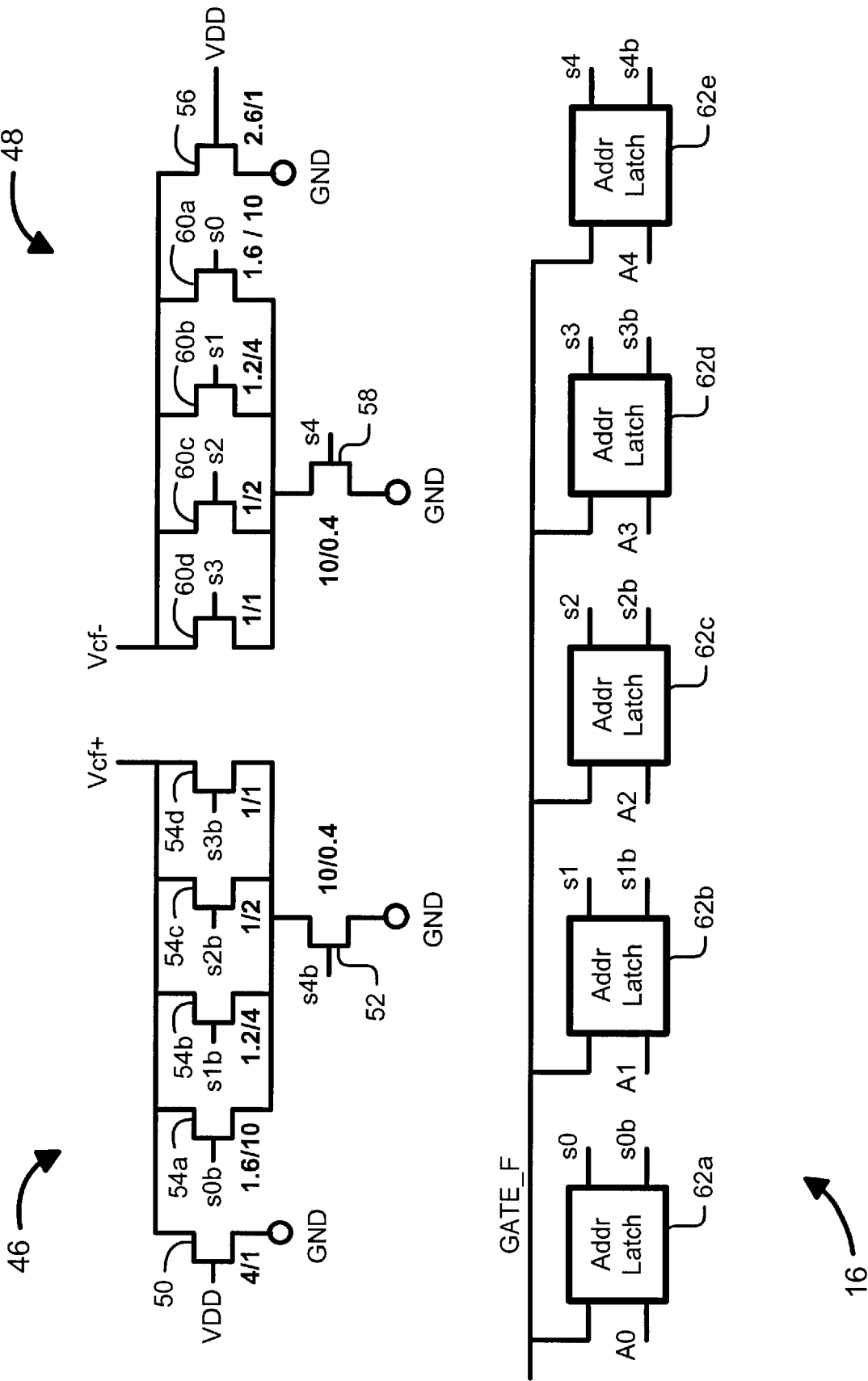
FIG. 3 is an illustration of a fine calibration circuit for the amplifier of FIG. 1.

Reference is now made to FIG. 3, which shows the fine calibration circuit 16 in greater detail. The fine calibration circuit 16 includes first and second programmable circuits 46 and 48 which combine with the first and second NMOS transistors 18c and 18d, respectively, to form first and second current mirrors. The programmable circuit 46 is shown, by way of example, as being formed by a first pair of transistors 50 and 52, and four middle transistors 54a, 54b, 54c and 54d having different drain-source path resistances. Turning ON different combinations of the middle transistors 54a, 54b, 54c and 54d will change the impedance levels in the first current mirror.

The second current mirror 48 is also shown, by way of example, as being formed by a second pair of transistors 56 and 58, and four middle transistors 60a, 60b, 60c and 60d having different drain-source path resistances. Turning ON different combinations of the middle transistors 60a, 60b, 60c and 60d will change the impedance level in the second current mirror.

During the normal mode of operation, the middle transistors 54a, 54b, 54c, 54d, 60a, 60b, 60c and 60d are turned ON and OFF according to a second number stored in a second group of static latches 62a, 62b, 62c and 62d.

A fifth latch 62e controls the transistors 52 and 58 so that either positive or negative correction is performed. The fine calibration circuit 16 shown in FIG. 3 can control the transistor impedance to as many as $2^5$ different levels.

Thus, the second number determines the impedance of the transistors 18a, 18b, 18c, 18d and 18e in the differential amplifier. The static latches 62a, 62b, 62c and 62d are unaffected by circuit noise or leakage.

Reference is once again made to FIG. 1. The integrated circuit 10 further includes a calibration control 64, a test current source 66 and a counter 68 for determining the first and second numbers that should be stored in the coarse and fine calibration circuits 14 and 16. During a calibration mode of operation, the test current source 66 supplies a test current $I_{test}$ to a node K. The magnitude of the test signal current $I_{test}$ may be selected to be approximately the value of the expected output signal current $I_{out}$ in the absence of offset error.

At the start of the calibration mode, the counter 68 begins counting from zero. The count is supplied to the latches 44a to 44e and 62a to 62e of the coarse and fine calibration circuits 14 and 16 via a control bus A0:A5. Coarse calibration is performed when the most significant bit A5 of the count is low, and fine calibration is performed when the most significant bit A5 is high. Thus, coarse calibration is performed, and then fine calibration is performed. Each time the count is incremented during coarse calibration, the level of the back gate bias voltage Vcc+ and Vcc− is changed. While the back gate bias voltage Vcc+ and Vcc− is being changed, a voltage excursion at the node K is examined. When the test current $I_{test}$ is greater than the output current $I_{out}$ of the charge amplifier 12, the voltage $V_{test}$ at the node K is pulled high, and when the test current $I_{test}$ is less than or equal to the output current $I_{out}$ the voltage Vtest at the node K is pulled low. When the node K goes from high to low or vice-versa, the voltage excursion at the node K is large enough to serve as a logic input to CMOS logic gates in the calibration control 64. When this voltage excursion occurs (that is, the new count causes the back gate bias voltage to change such that $I_{test}$ is less than or equal to $I_{out}$), the number that caused the voltage excursion is held in the latches 44a to 44e of the coarse calibration circuit 14. That number will be used to set the back gate bias voltage Vcc+ and Vcc− during the normal mode of operation.

The number held in the latches 44a to 44e of the coarse calibration circuit 14 is also used to set the back gate bias voltage Vcc+ and Vcc− during fine calibration. As the count is further incremented (and bit A5=0), the number stored in the latches 44a to 44e does not change. After the count has reached $2^5$, the next increment causes the most significant bit A5 to go high, the remaining bits A0 to A4 to go low, and the fine calibration to begin. The initial level of the test current $I_{test}$ is less than the output current $I_{out}$. Each time the count is incremented during fine calibration, the transistor impedance is changed to a new level. When another large voltage excursion occurs (due to the new count causing the transistor impedance to change such that that $I_{test}$ is greater than or equal to $I_{out}$), the number that caused the voltage excursion is held in the latches 62a to 62e of the fine calibration circuit 16. That number will be used to set the transistor impedance during the normal mode of operation.

Figure 4:
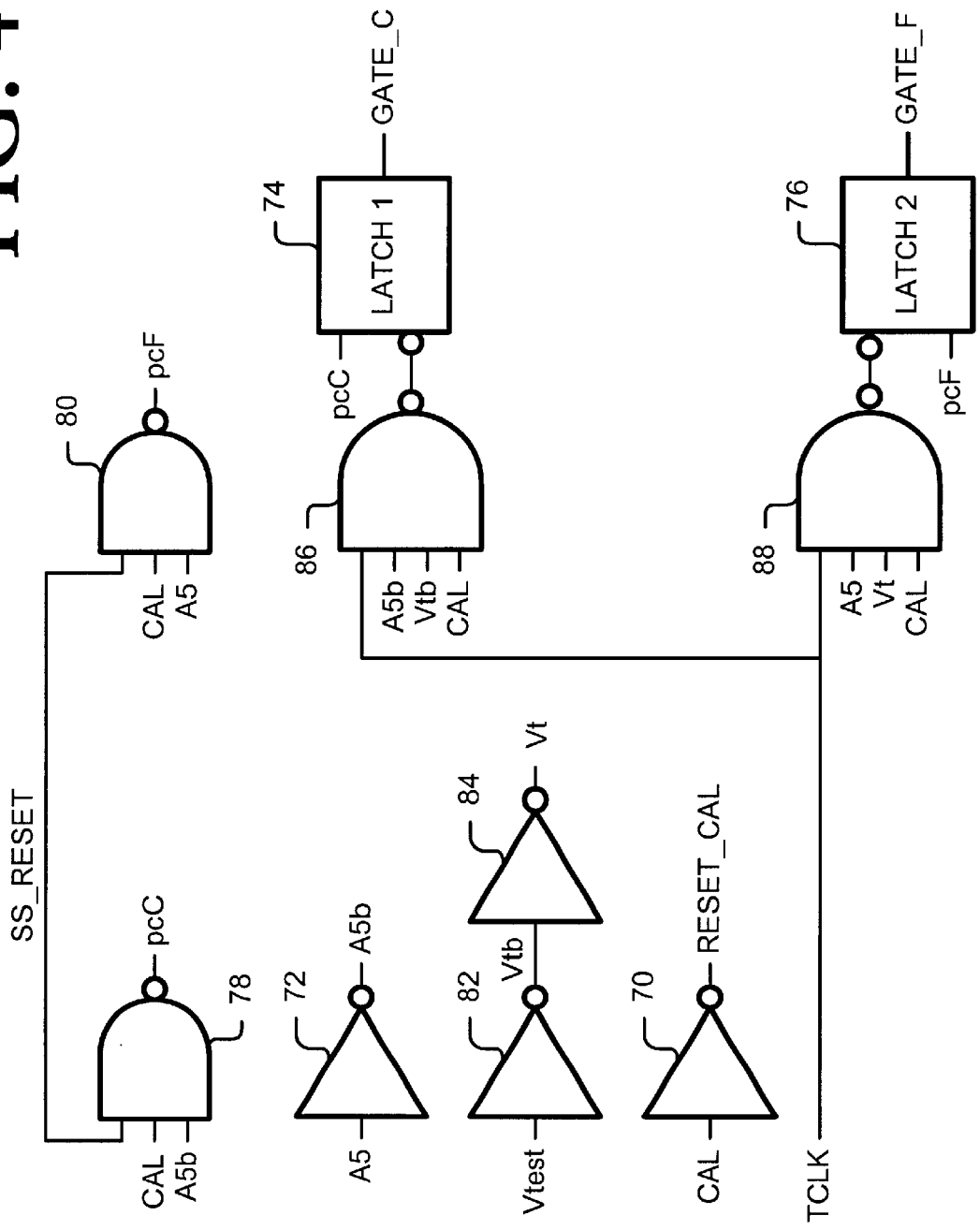
FIG. 4 is an illustration of a control circuit for the amplifier of FIG. 1.

Additional reference is now made to FIG. 4. The calibration control 64 controls the sequencing and overall flow of the calibration. Calibration is performed only when a calibrate signal CAL is high. The calibrate signal CAL is high during the calibration mode of operation, and it is low during the normal mode of operation. A first inverter 70 provides the inverted calibration signal or reset calibration signal RESET_CAL. The reset calibration signal RESET_CAL commands the test signal source 66 to generate the test signal $I_{test}$.

The fifth address bit A5, the most significant bit of the count, selects the coarse or fine calibration circuit 14 or 16. An input of a second inverter 72 receives the address bit A5 and an output of the second inverter 72 provides the signal A5b. When the single shot reset signal SS_RESET is low and the most significant bit A5 is low, coarse calibration is performed. When the single shot reset signal SS_RESET is low and the most significant bit A5 is high, fine calibration is performed.

First and second single-shot latches 74 and 76 may be used to control the sequencing of the calibration events. The single shot latches 74 and 76 are reset through NAND gates 78 and 80 when the signal SS_RESET is high.

An input of a third inverter 82 is connected to the node K. An output of the third inverter 82 provides the inverted signal Vtb and a fourth inverter 84 provides the non-inverted signal Vt. Thus, signals Vt and Vtb provided by the third and fourth inverters 82 and 84 indicate whether a voltage excursion has occurred. (The process of testing the node K is similar for both the coarse and fine calibrations; however, there is an inversion in the test signal that is part of the transition from the coarse to fine calibration tests. That is why the inverter 84 is provided; it accounts for the difference in testing the node K.)

If the count starts at 0, coarse calibration begins with a maximum negative offset. Each count up to thirty one reduces the offset. Once the voltage excursion occurs, that is, the signal Vt changes from a 0 to 1 or vice-versa, the first one shot 74 is triggered, whereby the count is held in the latches 44a to 44e of the coarse calibration circuit 14. Even as the count is further incremented, the count that corresponds to the voltage excursion will be held in the latches 44a to 44e.

When the count reaches thirty two, the most significant bit A5 is high and the other four bits A0 to A4 are low. Thus, coarse calibration is ended, and fine calibration begins with the maximum negative offset. Each subsequent increment reduces the offset.

The calibration control 64 also filters out switching transients during the current comparison. A first input of a third NAND gate 86 is connected to the node K through the third inverter 82, and a second input of the third NAND gate 86 is supplied with a test clock TCLK. When the test clock TCLK is high, the results of the current comparison are supplied to the first one-shot 74 during coarse calibration. Similarly, a first input of a fourth NAND gate 88 is connected to the node K through the third and fourth inverters 82 and 84, and a second input to the fourth NAND gate 88 is supplied with the test clock TCLK. When the test clock TCLK is high, the results of the current comparison are supplied to the second one-shot 76 during fine calibration. The switch transitions are restricted to the periods when the test clock TCLK is low. This allows for switching transitions and the circuit to settle to a stable value before testing the voltage at the node K. Thus, the third and fourth NAND gates 86 and 88 and the test clock TCLK are used to filter out switching transients and settling time effects that occur on the node K when the matching condition is being approached.

Counter frequency should be slower than the settling time. For example, a 10 MHz counter 68, which has a counter period of ten microseconds, may be used if the settling time is about one microsecond. A counter period that is longer than ten microseconds would be acceptable. A shorter counter period might run the risk of incomplete settling, which could cause errors in the offset calibration process.

The circuit 10 may be fabricated using a 0.5 micron ASIC CMOS process. The counter 68 may be located off-chip, whereby the count is supplied to I/O pads of the chip. However, it may be desirable to move the counter 68 onto the chip.

The test current source 66 should be on-chip and it should be physically close to the charge amplifier 12. Each charge amplifier 12 is provided with its own test current source 66 in applications such as sensing MRAM memory cells, where many charge amplifiers 12 may be operating simultaneously. Another reason for locating the test current source 66 on-chip is that the magnitude of the test current is small (on the order of 0.5 uA) and the current difference sensed during calibration is on the order of nano-amps. An on-chip test current source 66 is less subject to noise for the low current test conditions. The test current source 66 may be controlled by an external voltage reference (Vref in FIG. 1) or the reference voltage may be generated on the chip.

Figure 5:
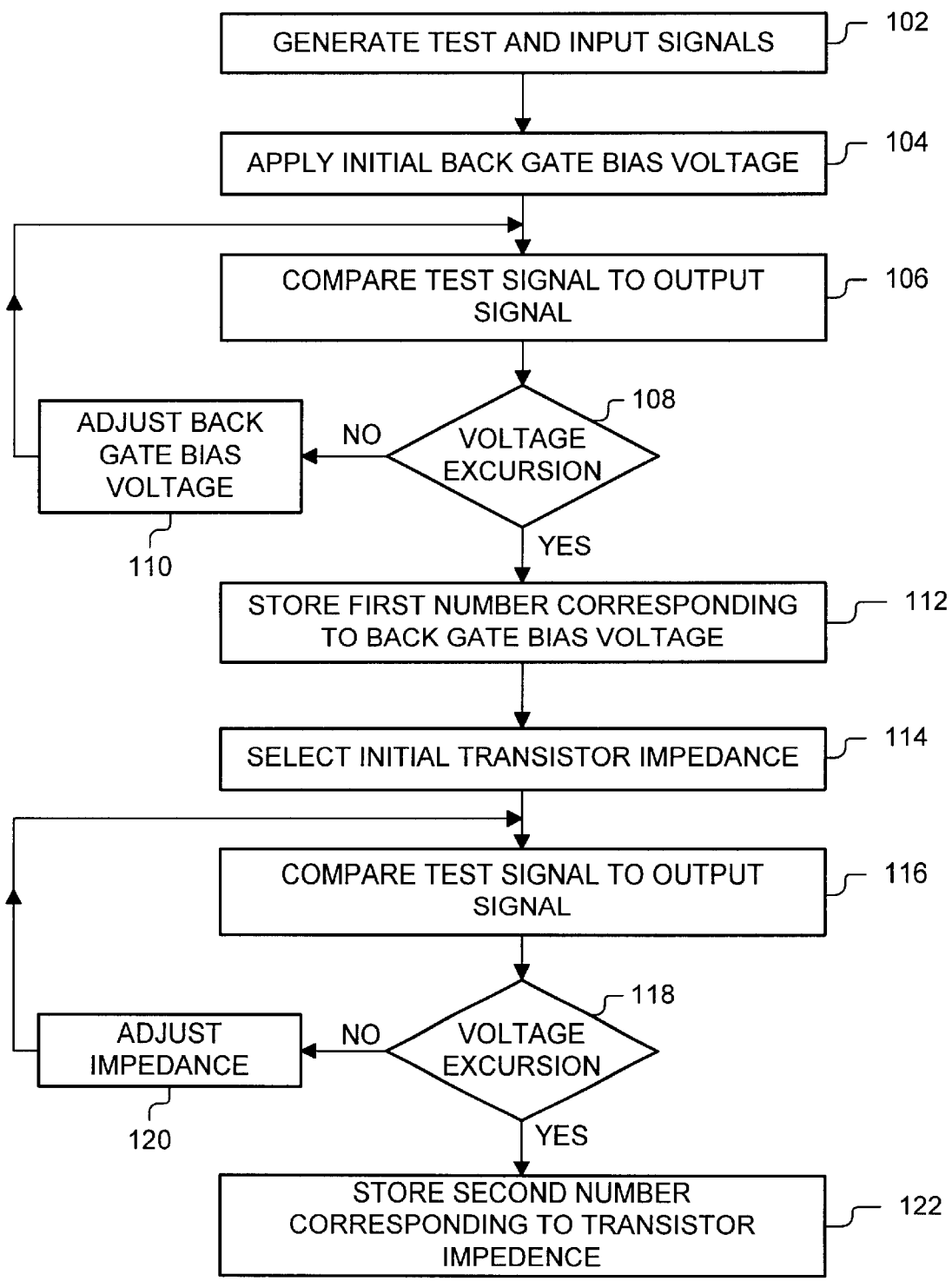
FIG. 5 is a flowchart of a method of calibrating the amplifier for offset error.

FIG. 5 shows a method of performing the offset calibration. Test and input signals are generated (block 102). The input signal is supplied to an input of the charge amplifier. In response to the input signal, the charge amplifier generates an output signal.

Coarse calibration is performed first. An initial back gate bias voltage is applied to the isolated wells in the substrate (block 104). For example, the initial back gate bias voltage causes a large initial offset $I_{test} > I_{out}$. The test signal $I_{test}$ is then compared to the output signal $I_{out}$ (block 106). If there is no voltage excursion (block 108), that is, if $I_{test} > I_{out}$, the back gate bias voltage is adjusted in a small steps (block 110) and another comparison is performed (block 106). The back gate bias voltage is adjusted in small steps until a voltage excursion occurs, that is, until $I_{test} \leq I_{out}$. Once the voltage excursion occurs, a first number corresponding to the back gate bias voltage that caused the voltage excursion is stored in the coarse calibration circuit 14 (block 112). The coarse calibration is now finished.

Fine calibration is then performed while the back gate bias voltage that caused the comparison change is being applied to the isolated wells. An initial transistor impedance is selected to cause $I_{test} < I_{out}$ (block 114). The test signal is then compared to the output signal (block 116). If $I_{test} < I_{out}$ (block 118), the transistor impedance is incrementally adjusted (block 120) and another comparison is performed (block 118). The transistor impedance is adjusted until $I_{test} \geq I_{out}$. Once the voltage excursion occurs, a second number corresponding to the transistor impedance that caused the voltage excursion is stored in memory (block 122). The fine calibration is now finished.

Although the coarse and fine calibration described above began with negative offsets ($I_{test} > I_{out}$), they could have begun instead with large positive offsets ($I_{test} < I_{out}$). Had the initial offset been positive for both coarse and fine calibration, the back gate bias voltage and transistor impedance would have been stepped down in small, digitally controlled steps until $I_{test} \geq I_{out}$.

Figure 6:
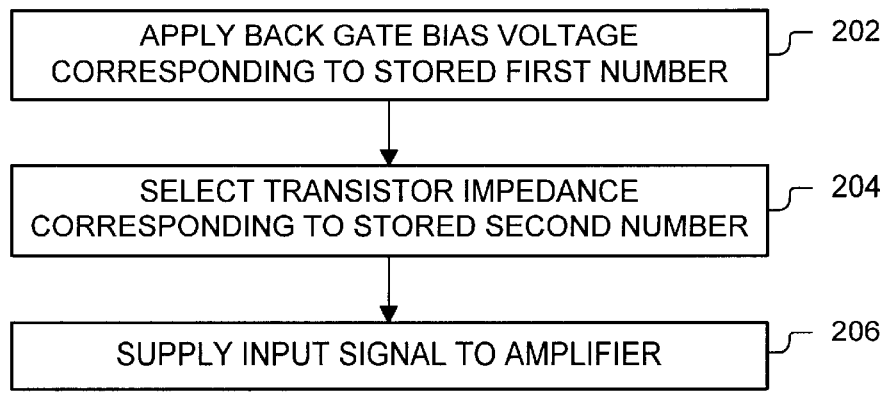
FIG. 6 is a flowchart of a method of operating the amplifier during a normal mode.

FIG. 6 shows a method of operating the circuit 10 during a normal mode The back gate bias voltage corresponding to the stored first number is applied to the isolated wells in the substrate (block 202), and the transistor impedance corresponding to the stored second number is selected (block 204). An input signal is then be applied to the operational amplifier (block 206).

Thus disclosed is an operational amplifier circuit having digital offset calibration. Calibration data does not drift with normal leakage currents. Whereas a switched capacitor circuit uses a large, isolated capacitor to store the analog offset data, the circuit having digital offset calibration stores the offset data in conventional CMOS static latches. Whereas the offset calibration data stored on the large capacitor is subject to degradation due to leakage currents. The latches hold a valid state until updated with new digital data. Thus, the use of special analog components such as low leakage transistors, resistors, or linear capacitors is avoided.

Figure 7:
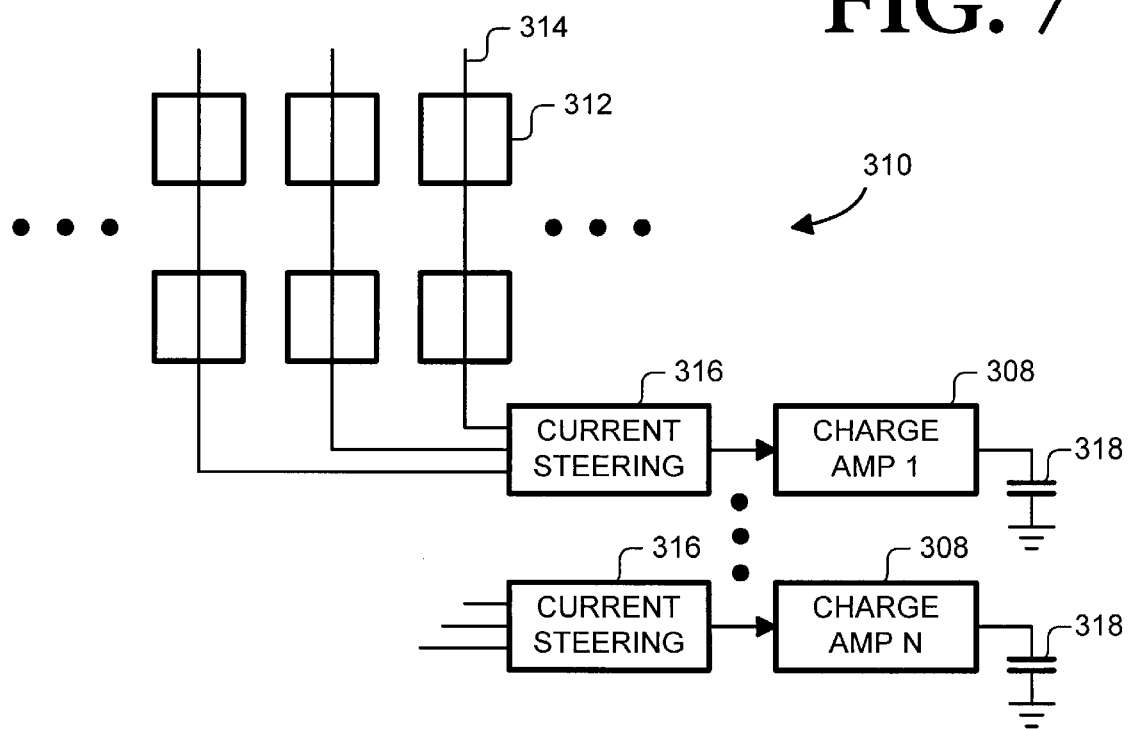
FIG. 7 is an illustration of a device including multiple direct injection charge amplifiers.

FIG. 7 shows an application for the operational amplifier circuits 10: the operational amplifier circuits 10 are used as direct injection charge amplifiers 308 in an MRAM device 310. The MRAM device 310 includes an array of memory cells 312. Traces functioning as bit lines 314 extend along columns of the memory cells 312. Each column is a potential source of an input current. The bit lines 314 of multiple contiguous columns are multiplexed into a single charge amplifier 308 by a steering circuit 316.

The steering circuit 316 includes a set of switches that connect each bit line 314 to either a constant voltage source or to a charge amplifier 308. The steering circuit 316 further includes a column decoder. The column decoder selects only one switch to connect only a selected bit line 314 to the sense amplifier (the current steering switch). All other (unselected) bit lines 314 are be connected to the constant voltage source. The constant voltage source may be supplied from an external circuit, and it may be used to set the output voltage of the charge amplifier 308 during the calibration and normal modes of operation.

An input signal on the selected bit line 314 is steered to the charge amplifier 308 and compared to the test current source 66. The input signal includes current from a selected MRAM memory cell 312 (that is, a memory cell crossed by word and bit lines that have been selected) and parasitic currents in the MRAM array. The parasitic currents in the MRAM array can arise from the voltage across the unselected memory cells 312 not being precisely equal to the applied array voltage. If the offset error is not properly calibrated, large parasitic currents can occur during sensing of the memory cells 312. These large parasitic currents can cause errors in sensing the resistance of the MRAM memory cells 312. The operation of the charge amplifier 308 is to minimize the voltage difference across the unselected array elements.

The charge amplifier 308 controls the voltage across the memory cells 312 connected to the selected bit line 314, independent of a sense current flowing through the selected memory cell 312. When a constant voltage is applied to all memory cells 312 (that is an equipotential across the memory cells), variations in resistance do not cause a current variation across the remaining parallel memory cells 312 and, thus, the parasitic sense current is made substantially less than the sense current. The current that flows in the charge amplifier 308 is directly proportional to the resistance of the selected memory cell 312 without having to make corrections or adjustments for variations in sense voltage.

An integrator capacitor 318 is charged by the sense current. Charge time is partly dependent upon the resistance of the selected memory cell 312. A sense amplifier (not shown) uses the charge time of the capacitor 318 to determine the resistance of the selected memory cell 312. The resistance is either at a first state R or a second state R+ΔR.

The calibration circuits 14, 16, 64 and 66, 68 also correct for errors in the current steering circuit 316 and other circuits forming a part of the input current path. This effect greatly relaxes the design tolerances of the circuit design with respect to the sizing of current steering devices and multiplexer switches.

Additional sets of steering circuits 316 and charge amplifiers 308 can receive input signals from other columns of memory cells (not shown). These additional sets can operate in parallel and independently of one another. To access an m-bit word, up to m sets of steering circuits 316 and charge amplifiers 308 are operated in parallel. A single control signal (not shown) controls all of the steering circuits 316 simultaneously.

Each charge amplifier 308 may be calibrated independently of the other charge amplifiers 308 in the MRAM device 310. However, all may be calibrated at the same time and may share the same set of external calibration and counter signals.

Figure 8:
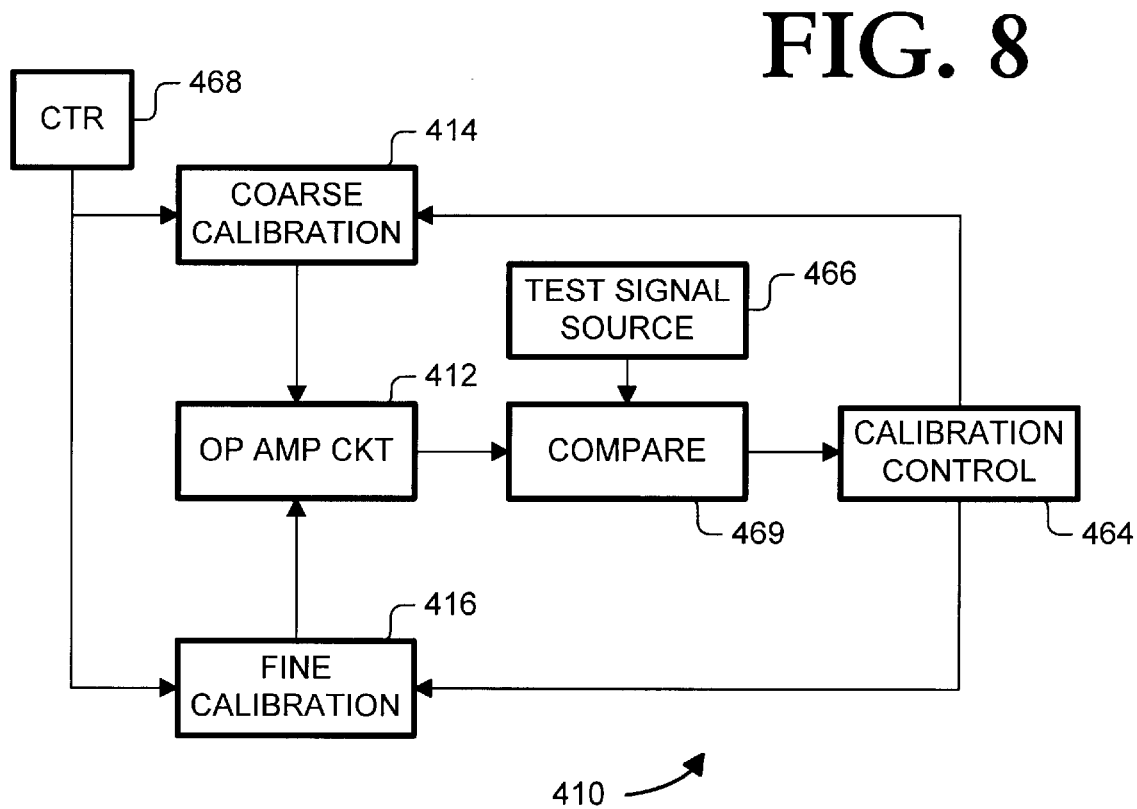
FIG. 8 is an illustration of an alternative embodiment of the amplifier of FIG. 1.

Although the operational amplifier circuit 10 may be used for sensing the resistance of MRAM memory cells, it is not limited to such an application. Moreover, the present invention is not limited to direct injection charge amplifiers. For example, FIG. 8 shows a circuit 410 including an operational amplifier 412 such as a unity gain amplifier or transimpedance amplifier, coarse and fine calibration circuits 414 and 416, a calibration control 464, a test signal source 466, a counter 468, and a circuit 469 for sensing when the output current is within an acceptable limit of the test current for each of the coarse and fine calibrations.

The present invention is not limited to two stage calibration. Single stage calibration may be performed by adjusting the back gate bias voltage. For such calibration, the number of voltage dividers may be increased to provide a greater resolution for the back gate bias voltage.

Similarly, single stage calibration may be performed by changing the transistor impedance. For such calibration, the number of transistors in the first and second programmable circuits 46 and 48 may be increased to provide a greater number of impedance levels in the current mirrors.

Accordingly, the invention is not limited to the specific embodiments described and illustrated above. Instead, the invention is construed according to the claims that follow.

What is claimed is:

1. An integrated circuit having a calibration mode of operation and a normal mode of operation, the circuit comprising:

an operational amplifier including a plurality of transistors for providing a controlled current path, at least some of the transistors being in isolated wells in a substrate;

a programmable calibration circuit, responsive to a digital value, for performing at least one of (a) providing a back gate bias voltage to at least one isolated well and (b) adjusting impedance of the transistors providing the controlled current path, level of the back gate bias voltage and an amount of impedance adjustment being determined by the digital value, whereby different digital values may be supplied to the programmable calibration circuit during the calibration mode of operation;

a test circuit including a test signal source for generating a test signal during the calibration mode of operation; and memory for storing a digital value that causes an output signal from the operational amplifier to be within a desired limit of the test signal during the calibration mode, the memory providing the stored value to the calibration circuit during the normal mode of operation.

2. The circuit of claim 1, wherein the programmable calibration circuit includes:

a coarse calibration circuit, responsive to the digital value, for applying a desired back gate correction voltage to at least one isolated well; and a fine calibration circuit for adjusting the impedance of the transistors providing the controlled current path, the impedance being adjusted in response to the digital value.

3. The circuit of claim 2, wherein the test circuit further includes a control for ending the coarse calibration when a comparison of test signal current amplitude to output current amplitude is reversed and for ending the fine calibration when a comparison of test signal current amplitude to output current amplitude is reversed, the control causing a first portion of the digital value to be stored in the memory when the coarse calibration is ended, the control causing a second portion of the digital value to be stored in the memory when the fine calibration is ended.

4. The circuit of claim 3, further comprising an additional transistor having a gate coupled to an output of the operational amplifier, the additional transistor having a drain-source path coupled to the test signal source, a voltage drop along the drain-source path indicating when the comparison is reversed.

5. The circuit of claim 2, wherein the coarse calibration circuit includes a plurality of first transistors forming a plurality of voltage dividers, the first transistors being selected to apply the back gate bias voltage to at least one isolated well; and wherein the fine calibration circuit includes a plurality of second transistors, the second transistors being selected to adjust the impedance of the transistors providing the controlled current path.

6. The circuit of claim 5, further comprising means, responsive to a test clock, for determining when transients caused by selecting the first and second transistors have settled, the comparison of the test current and the output current being made when the transients have settled.

7. The circuit of claim 2, wherein the digital value includes first and second numbers; and wherein the memory includes a plurality of first registers for storing the first number during the calibration mode and a plurality of second registers for storing the second number during the calibration mode, the plurality of first registers supplying the first number to the coarse calibration circuit during the normal mode and during the fine calibration of the calibration mode, the plurality of second registers supplying the second number to the fine calibration circuit during the normal mode.

8. The circuit of claim 7, wherein the test circuit further includes a control and first and second one-shots, the control triggering the first one-shot when the coarse calibration is finished, the first triggered one-shot causing the first number to be held in the first plurality of registers, the fine calibration being performed after the coarse calibration has been performed, the control causing the second one-shot to be triggered when the fine calibration is finished, the triggered second one-shot causing the second number to be held in the second plurality of registers.

9. The circuit of claim 2, further comprising a modulo counter for providing a plurality of different digital values to the calibration circuit during the calibration mode.

10. The circuit of claim 1, further comprising means for determining when the test signal is within an acceptable limit of the output signal.

11. The circuit of claim 1, wherein the transistors in the isolated wells are p-channel transistors.

12. A circuit comprising a plurality of amplifiers according to claim 1; and a current steering circuit coupled to respective inputs of the plurality of amplifiers; whereby error of the steering circuit is also calibrated during the calibration mode.

13. An integrated circuit comprising:

an operational amplifier including a plurality of transistors, at least some of the transistors being in isolated wells in a substrate;

a first circuit, responsive to a first digital number, for applying a back gate bias voltage to at least one isolated well, level of the back gate bias voltage being determined by the first digital number;

a second circuit responsive to a second digital number for adjusting impedance of the transistors, amount of the impedance adjustment being determined by a second digital number; and memory for supplying the first and second digital numbers to the first and second circuits, the digital numbers causing offset of the amplifier to be calibrated within a desired limit.

14. The circuit of claim 13, further comprising means for determining the first and second digital numbers stored in the memory.

15. The circuit of claim 13, wherein the operational amplifier is a direct injection charge amplifier.

16. The circuit of claim 13, further comprising a test signal source for generating a test signal during a calibration mode of operation; wherein the first and second digital numbers are adjusted by the first and second circuits to cause an output signal from the operational amplifier to be within the desired limit of the test signal during the calibration mode.

17. The circuit of claim 16, further comprising a control for ending calibration by the first circuit when a comparison of test signal current amplitude to output current amplitude is reversed and for ending the calibration by the second circuit when a comparison of test signal current amplitude to output current amplitude is reversed.

18. The circuit of claim 17, further comprising an additional transistor having a gate coupled to an output of the operational amplifier, the additional transistor having a drain-source path coupled to the test signal source, a voltage drop along the drain-source path indicating when each comparison is reversed.

19. The circuit of claim 13, wherein the first circuit includes a plurality of first transistors forming a plurality of voltage dividers, the first transistors being selected to apply the back gate bias voltage to at least one isolated well; and wherein the second circuit includes a plurality of second transistors, the second transistors being selected to adjust the impedance of the transistors of the operational amplifier.

20. The circuit of claim 13, wherein the memory includes a plurality of first registers for storing the first digital number and supplying the first digital number to the first circuit; and wherein the memory further includes a plurality of second registers for storing the second digital number and supplying the second digital number to the second circuit.

21. The circuit of claim 13, wherein the transistors in the isolated wells are p-channel transistors.

22. A method of calibrating offset error in an operational amplifier, the amplifier including at least one transistor in an isolated well, the method comprising the steps of:

generating a test signal;

supplying an input signal to the operational amplifier;

comparing an output signal of the operational amplifier to the test signal;

adjusting at least one of (a) back gate bias voltage to at least one isolated well and (b) transistor impedance; and storing a number that corresponds to a back gate bias and transistor impedance that causes the output signal to be within an acceptable limit of the test signal.

23. The method of claim 22, further comprising the step of accessing the stored number during normal operation of the operational amplifier, back gate bias voltage and transistor impedance of the operational amplifier being set to the back gate bias voltage and transistor impedance corresponding to the stored number.

24. The method of claim 22, wherein coarse calibration is performed until a first comparison of test signal current amplitude to output current amplitude is reversed; and wherein fine calibration is then performed until a second comparison of test signal current amplitude to output current amplitude is reversed.

25. The method of claim 24, wherein an additional transistor has a gate coupled to an output of the operational amplifier and a drain-source path coupled to an input of the operational amplifier; and wherein each comparison reversal is detected by examining a voltage drop along the drain-source path.

26. The method of claim 24, wherein the coarse calibration is performed by adjusting the back gate bias voltage in increments until the first comparison reversal occurs; and wherein the fine calibration is performed by adjusting the transistor impedance in increments until the second comparison reversal occurs.

* * * * *